United States Patent
Kanai et al.

(10) Patent No.: US 10,418,359 B2
(45) Date of Patent: Sep. 17, 2019

(54) SEMICONDUCTOR DEVICE AND MANUFACTURING METHOD

(71) Applicant: FUJI ELECTRIC CO., LTD., Kanagawa (JP)

(72) Inventors: Naoyuki Kanai, Matsumoto (JP); Motohito Hori, Matsumoto (JP); Satoshi Kaneko, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 1 day.

(21) Appl. No.: 15/390,683

(22) Filed: Dec. 26, 2016

(65) Prior Publication Data

US 2017/0236819 A1  Aug. 17, 2017

(30) Foreign Application Priority Data

Feb. 17, 2016 (JP) .................................. 2016-027946

(51) Int. Cl.
*H01L 29/16* (2006.01)
*H01L 27/06* (2006.01)
(Continued)

(52) U.S. Cl.
CPC ........ *H01L 27/0629* (2013.01); *H01L 21/565* (2013.01); *H01L 23/24* (2013.01); *H01L 23/3135* (2013.01); *H01L 23/3178* (2013.01); *H01L 25/0655* (2013.01); *H01L 29/0619* (2013.01); *H01L 29/1608* (2013.01); *H01L 29/66143* (2013.01); *H01L 29/66333* (2013.01); *H01L 29/7395* (2013.01); *H01L 29/872* (2013.01); *H01L 23/049* (2013.01); *H01L 24/48* (2013.01); *H01L 24/49* (2013.01); *H01L 24/85* (2013.01); *H01L 2224/05552* (2013.01); *H01L 2224/0603* (2013.01); *H01L 2224/45015* (2013.01); *H01L 2224/45124* (2013.01);
(Continued)

(58) Field of Classification Search
CPC ..... H01L 27/06; H01L 27/0629; H01L 23/00; H01L 23/31; H01L 23/3178; H01L 29/16; H01L 29/66; H01L 29/739; H01L 29/872; H01L 29/0619; H01L 29/1608; H01L 29/66333; H01L 29/7395; H01L 29/66143; H01L 23/24; H01L 23/049; H01L 23/3135; H01L 24/48; H01L 24/49; H01L 24/85
USPC .......................................................... 257/77
See application file for complete search history.

(56) References Cited

U.S. PATENT DOCUMENTS

| 8,936,966 B2* | 1/2015 | Hung ..................... H01L 24/94 257/E21.499 |
| 2005/0202590 A1* | 9/2005 | Huang ................ H01L 21/6835 438/106 |

(Continued)

FOREIGN PATENT DOCUMENTS

JP         2004-95670 A       3/2004

*Primary Examiner* — Chuong A Luu

(57) ABSTRACT

A semiconductor device 100 includes a semiconductor element 12 having an electrode on a front surface, a wire 15 bonded to the electrode of the semiconductor element 12, a resin layer 22b covering a bonding portion of the wire 15 on the front surface of the semiconductor element 12, and a gel filler material 23 that seals the semiconductor element 12, the wire 15, and the resin layer 22b. By protecting the bonding portion of the wire 15 with the resin layer 22b, degradation of the wire 15 is ameliorated and the reliability of the semiconductor device 100 is improved.

9 Claims, 13 Drawing Sheets

(51) Int. Cl.
*H01L 21/56* (2006.01)
*H01L 23/31* (2006.01)
*H01L 29/06* (2006.01)
*H01L 29/66* (2006.01)
*H01L 29/739* (2006.01)
*H01L 29/872* (2006.01)
*H01L 25/065* (2006.01)
*H01L 23/24* (2006.01)
H01L 23/00 (2006.01)
H01L 23/049 (2006.01)

(52) U.S. Cl.
CPC ............... *H01L 2224/45147* (2013.01); *H01L 2224/484* (2013.01); *H01L 2224/48105* (2013.01); *H01L 2224/48137* (2013.01); *H01L 2224/48227* (2013.01); *H01L 2224/49111* (2013.01); *H01L 2224/8592* (2013.01); *H01L 2924/00014* (2013.01); *H01L 2924/13055* (2013.01)

(56) References Cited

U.S. PATENT DOCUMENTS

| 2011/0266701 | A1* | 11/2011 | Wan | H01L 21/568 |
| | | | | 257/782 |
| 2015/0076517 | A1* | 3/2015 | Terai | H01L 24/49 |
| | | | | 257/77 |
| 2016/0118326 | A1* | 4/2016 | Kwon | H01L 21/4853 |
| | | | | 257/621 |

* cited by examiner

SEMICONDUCTOR DEVICE AND MANUFACTURING METHOD

SEMICONDUCTOR DEVICE AND MANUFACTURING METHOD

The contents of the following Japanese patent application are incorporated herein by reference:
NO. 2016-027946 filed on Feb. 17, 2016.

BACKGROUND

1. Technical Field

The present invention relates to a semiconductor device and a manufacturing method.

2 Related Art

In the field of renewable energy such as solar power and wind power, the field of automobiles such as hybrid automobiles and electric automobiles, and any field that demands efficient power conversion such as trains, power semiconductor devices (referred to hereinafter simply as semiconductor devices) are widely used. A next-generation semiconductor element such as a silicon carbide (SiC) compound semiconductor element is mounted in such a semiconductor device. For example, Patent Document 1 discloses a semiconductor device in which an SiC diode is reversely connected in parallel with a silicon (Si) semiconductor switch. An SiC compound semiconductor element has a high withstand voltage because the insulated breakdown electrical field strength is higher than that of a conventional Si semiconductor element, and it is possible to realize a miniature semiconductor device that is capable of operating with high efficiency and at high speed because this SiC compound semiconductor element has a higher impurity concentration and a thinner active layer than a conventional Si semiconductor element.

Patent Document 1: Japanese Patent Application Publication No. 2004-95670

However, although it is possible for the SiC compound semiconductor element to withstand being used at high temperatures, there is a problem that the reliability of the semiconductor device drops due to degradation of the wire bonding portions and the electrode films when the chip junction temperature increases.

Although a large current capacity is desired for a semiconductor device, it is impossible to make an SiC compound semiconductor element as large as an Si semiconductor element due to insufficient crystal quality, and therefore an electrical field relaxing region (also referred to as a guard ring) provided in the circumferential edge of the semiconductor element must be designed to be thin. Here, due to a strong electrical field being focused on the guard ring, insulation breakdown can occur at the interface between the semiconductor element and the gel filler material used to seal the semiconductor element.

SUMMARY

According to a first aspect of the present invention, provided is a semiconductor device comprising a first semiconductor element that includes a first front surface electrode and a first guard ring; a second semiconductor element that includes a second front surface electrode and a second guard ring; a first wire that is bonded to the first front surface electrode; a second wire that is bonded to the second front surface electrode; a first resin layer that covers at least one of the first guard ring and the second guard ring; and a gel filler material that seals the first semiconductor element, the second semiconductor element, the first wire, the second wire, and the first resin layer.

According to a second aspect of the present invention, provided is a semiconductor device manufacturing method, comprising bonding a first wire to a first front surface electrode of a first semiconductor element including the first front surface electrode; forming a second resin layer that covers a first bonding portion of the first front surface electrode and the first wire; and sealing the first semiconductor element, the first wire, and the second resin layer with a gel filler material.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1A:
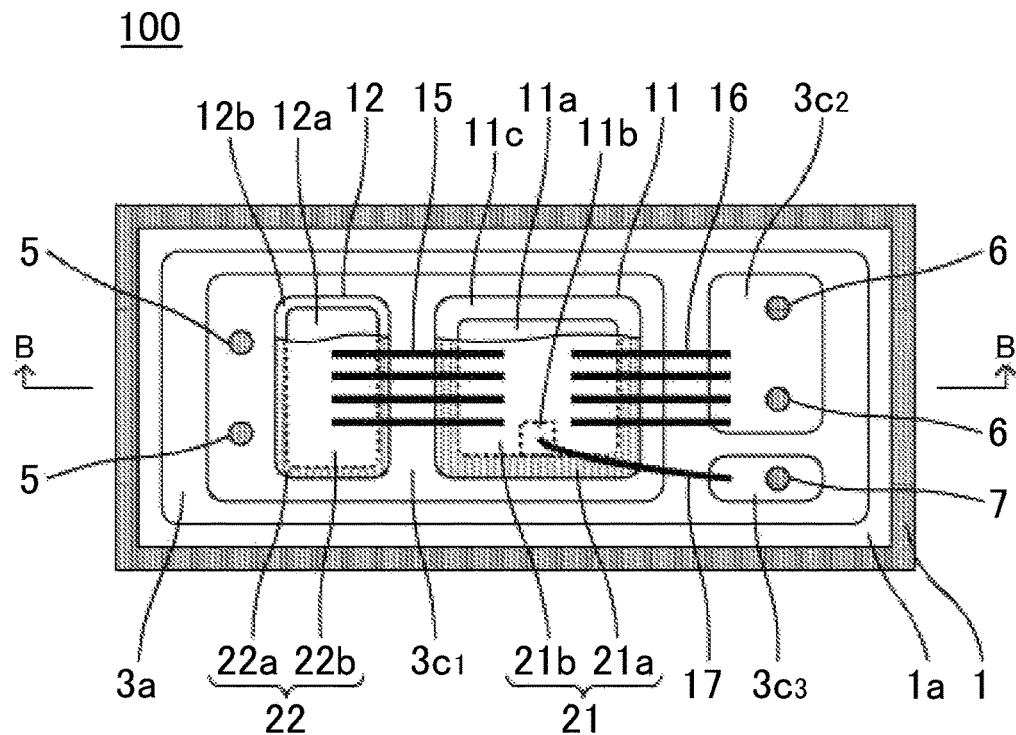
FIG. 1A shows the configuration of the semiconductor device according to the present embodiment from an overhead view relating to the reference line AA shown in FIG. 1B.
Figure 1B:
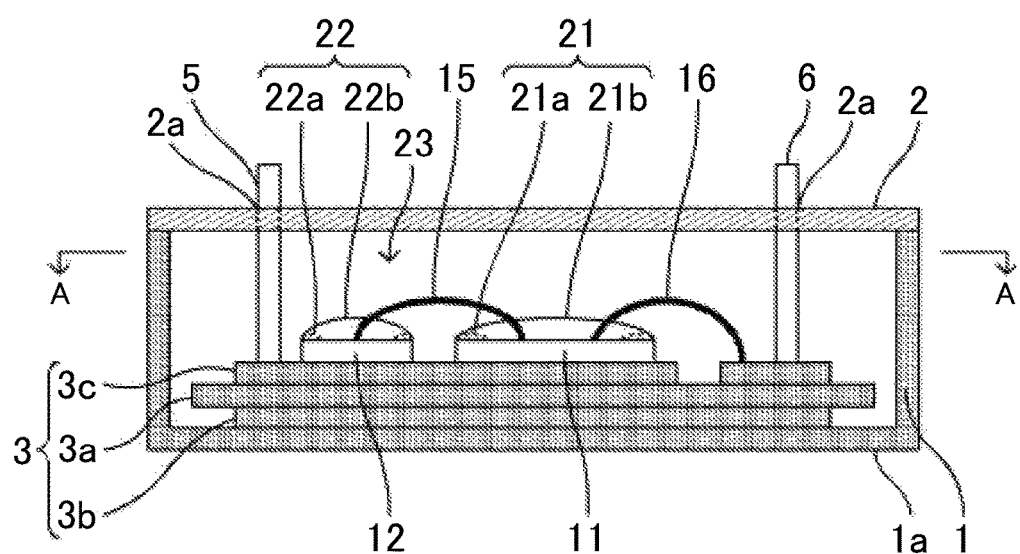
FIG. 1B shows a cross-sectional configuration of the semiconductor device according to the present embodiment from a side view relating to the reference line BB shown in FIG. 1A.

FIGS. 1A and 1B show a configuration of a semiconductor device 100 according to the present embodiment. FIG. 1A shows the configuration from an overhead view relating to the reference line AA shown in FIG. 1B, and FIG. 1B shows a cross-sectional configuration from a side view relating to the reference line BB shown in FIG. 1A. The semiconductor device 100 includes a case 1, a cover 2, an insulated substrate 3, terminals 5, 6, and 7, semiconductor elements 11 and 12, wires 15, 16, and 17, resin layers 21 and 22, and a gel filler material 23 in order to ensure the reliability of the semiconductor device by using a resin layer to protect a bonding portion where a wire is bonded to an electrode of the semiconductor element mounted in the semiconductor device 100 and to improve the withstand voltage of the semiconductor device by using a resin layer to protect the guard ring of the semiconductor element.

The case 1 is a chassis that houses each configurational component of the semiconductor device 100, and the bottom portion of this case 1 is included as a base substrate 1a. The base substrate 1a supports each configurational component of the semiconductor device 100 mounted thereon. The base substrate 1a can be a copper (Cu) substrate, an aluminum silicon carbide (Al—SiC) substrate, or the like, with high thermal dissipation. The base substrate 1a forming the bottom portion of the case 1 may be formed independently from the frame forming the side portions, and the case 1 may be formed by establishing a frame along the circumferential edge of the base substrate 1a.

The cover 2 is a flat lid that is mounted on the side portion of the case 1 and seals each configurational component of the semiconductor device 100 within the case 1. The cover 2 has a plurality of openings 2a formed therein that allow the top ends of the terminals 5, 6, and 7 to protrude outside the case 1.

The insulated substrate 3 is a substrate on which the semiconductor elements 11 and 12 are mounted, and can be a DCB (Direct Copper Bonding) substrate, an AMB (Active Metal Blazing) substrate, or the like, for example. The insulated substrate 3 includes an insulated board 3a, a metal layer 3b, and a wiring layer 3c. The insulated board 3a is a board-shaped member formed from insulating ceramic such as aluminum nitride, silicon nitride, aluminum oxide, or the like, for example, and has a thickness from 0.2 mm to 1 mm, for example. The metal layer 3b is provided on the bottom surface of the insulated board 3a using conductive metal such as copper, aluminum, or the like, and has a thickness from 0.1 mm to 1 mm, for example. In order to achieve rust proofing or the like, a plating process using nickel or the like may be performed on the surface of the metal layer 3b. The wiring layer 3c is provided on the top surface of the insulated board 3a using a conductive metal such as copper or aluminum, in the same manner as the metal layer 3b. The insulated substrate 3 is secured onto the base substrate 1a, with a bonding material (not shown) such as solder interposed therebetween.

The wiring layer 3c of the insulated substrate 3 has three wiring patterns $3c_1$, $3c_2$, and $3c_3$. The wiring pattern $3c_1$ has a rectangular shape and is provided in a region occupying approximately ⅔ of the insulated board 3a on the left side in the drawing. The wiring pattern $3c_1$ is provided with the semiconductor elements 11 and 12 described further below in parallel. The wiring patterns $3c_2$ and $3c_3$ each have a rectangular shape and are provided in parallel within the region occupying approximately ⅓ of the insulated board 3a on the right side in the drawing.

The terminals 5, 6, and 7 are input/output terminals for inputting external signals into the semiconductor element 11 or inputting/outputting current from the semiconductor element 11 to the outside. The terminals 5, 6, and 7 are formed as cylinders or flat boards using conductive metal such as copper or aluminum, for example. Two terminals 5 are established near the left end of the wiring pattern $3c_1$ of the wiring layer 3c. The terminals 5 are connected to the collector electrode of the semiconductor element 11 and the cathode electrode of the semiconductor element 12 described further below, via the wiring pattern $3c_1$. Two terminals 6 are established on the wiring pattern $3c_2$ of the wiring layer 3c. The terminals 6 are connected to the emitter electrode 11a of the semiconductor element 11 and the anode electrode 12a of the semiconductor element 12, via the wiring pattern $3c_2$ and the wires 15 and 16. One terminal 7 is established on the wiring pattern $3c_3$ of the wiring layer 3c. The terminal 7 is connected to the gate electrode 11b of the semiconductor element 11 via the wiring pattern $3c_3$ and the wire 17. The terminals 5, 6, and 7 are established on the wiring patterns using a bonding material (not shown) such as solder, and the tip of each terminal protrudes outside the case 1 through an opening 2a of the cover 2. The terminals 5, 6, and 7 may be insert molded in advance in the case 1 or cover 2.

The semiconductor element 11 is an Si semiconductor element incorporated in the semiconductor device 100 according to the present embodiment, and can be a vertical power metal oxide semiconductor field effect transistor (power MOSFET), an insulated gate bipolar transistor (IGBT), or the like, having electrodes on the front and back surfaces, for example. The semiconductor element 11 is not limited to being a vertical element, and may be a horizontal element with electrodes provided only on the front surface. If the semiconductor element 11 is an IGBT (or a power MOSFET), an emitter electrode (or source electrode) 11a and a gate electrode 11b are provided on the front surface, a guard ring 11c is provided in the edge on the front surface or around these electrodes, and a collector electrode (or drain electrode) (not shown) is provided on the back surface. The semiconductor element 11 is secured with its back surface on the insulated substrate 3, by connecting the collector electrode (or drain electrode) to the wiring pattern $3c_1$ of the wiring layer 3c using a bonding material (not shown) such as solder.

The semiconductor element 12 is an SiC semiconductor diode incorporated in the semiconductor device 100 according to the present embodiment, and can be a Schottky barrier diode (SBD) connected in a reverse parallel manner with the semiconductor element 11, for example. The semiconductor element 12 includes an anode electrode 12a on the front surface, a guard ring 12b provided surrounding the electrode or on an edge on the front surface, and a cathode electrode (not shown) on the back surface. The semiconductor element 12 is secured with its back surface on the insulated substrate 3, by connecting the cathode electrode to the wiring pattern $3c_1$ of the wiring layer 3c using a bonding material (not shown) such as solder. The cathode electrode of the semiconductor element 12 is connected to the collector electrode of the semiconductor element 11 by the wiring pattern $3c_1$ of the wiring layer 3c.

The wires 15, 16, and 17 are wire-shaped members that create a bond between front surface electrodes of the semiconductor elements 11 and 12 or bond these front surface electrodes to the wiring patterns $3c_1$ and $3c_2$. For example, the wires 15, 16, and 17 are formed using a conductive metal such as copper or aluminum, or a conductive alloy such as an iron-aluminum alloy, and each wire has a diameter from 300 μm to 500 μm for a device with a high withstand voltage, for example. The wire 15 includes a plurality of wires (4 wires in the example of the present embodiment), and the ends of the wire 15 are respectively bonded to the front surface electrode of the semiconductor element 11, i.e. the emitter electrode 11a, and the front surface electrode of the semiconductor element 12, i.e. the anode electrode 12a. The wire 16 includes a plurality of wires (4 wires in the example of the present embodiment), and connects the front surface electrode of the semiconductor element 11, i.e. the emitter electrode 11a, to the wiring pattern $3c_2$. The wire 17 includes one wire (though it may include a plurality of wires), and connects the front surface electrode of the semiconductor element 11, i.e. the gate electrode 11b, to the wiring pattern $3c_3$. The wires 15 and 16 are formed integrally using stitch bonding at the electrodes of the semiconductor element 11, and may form wiring that is continuous from the front surface electrode of the semiconductor element 12 to the wiring pattern $3c_3$.

The resin layers 21 and 22 respectively cover the front surface of the semiconductor elements 11 and 12, and are members that protect the bonding portions of the wires 15, 16, and 17 and the guard rings 11c and 12b. The resin layers 21 and 22 include polyimide such as polyimide resin (with a glass transition temperature Tg of 324° C.) or polyamide resin (with a glass transition temperature Tg of 275° C.), for example.

When an SiC device is employed as the semiconductor element 11 or 12, the chip junction temperature ($T_{jmax}$) thereof is expected to increase to 175° C., for example, and therefore polyimide having a glass transition temperature Tg greater than or equal to 200° C., for example, that is sufficiently higher than the chip junction temperature is used. Furthermore, if the semiconductor device 100 is placed in a higher temperature environment during the manufacturing process, polyimide having an even higher glass transition temperature may be used. Therefore, the resin layers 21 and 22 maintain their hardness and the wires 15, 16, and 17 are secured to the electrodes of the semiconductor elements 11 and 12, and the bonding portions between each wire and an electrode can be protected. Here, if the semiconductor elements 11 and 12 have different front surface electrode structures, each wire must be bonded to an electrode using suitable conditions according to the respective structures. With regard to this, it is possible to bond each wire to an electrode under the same conditions regardless of the structures of the front surface electrodes, by covering the electrodes with the resin layers 21 and 22.

The thickness of each resin layer 21 and 22 is from 10 μm to 50 μm, for example. Therefore, the electrical field relaxing effect is obtained and, in particular, it is possible to maintain the insulation at the interface between the guard rings 11c and 12b and the gel filler material 23. The electrical field relaxing effect realized by the resin layers 21 and 22 is not significantly improved when the film thickness is made greater than or equal to 50 μm.

The resin layer 21 includes a first resin layer 21a and a second resin layer 21b formed integrally. The first resin layer 21a is provided on the circumferential edge on the front surface of the semiconductor element 11, and covers the guard ring 11c of the semiconductor element 11. The second resin layer 21b is provided in the center of the front surface of the semiconductor element 11 and covers the bonding portions of the wires 15 and 16 bonded with the emitter electrode 11a and also covers the bonding portion of the wire 17 bonded to the gate electrode 11b. The resin layer 21 may include the first resin layer 21a and the second resin layer 21b as separate layers.

The resin layer 22 includes a first resin layer 22a and a second resin layer 22b formed integrally. The first resin layer 22a is provided on the circumferential edge on the front surface of the semiconductor element 12, and covers the guard ring 12b of the semiconductor element 12. The second resin layer 22b is provided in the center of the front surface of the semiconductor element 12 and covers the bonding portion of the wire 15 bonded to the anode electrode 12a. The resin layer 22 may include the first resin layer 22a and the second resin layer 22b as separate layers.

The resin layers 21 and 22 may include at least a portion of the front surface of the wiring pattern $3c_1$ and may be provided integrally on both front surfaces of the semiconductor elements 11 and 12. In this way, the electrical field strength generated at the side surfaces of the semiconductor elements 11 and 12 can be relaxed. Here, all of the wire 15 may be covered by the resin layers 21 and 22. The resin layers may be provided at the bonding portion of the wire 16 bonded to the wiring pattern $3c_2$ of the wiring layer 3c and at the bonding portion of the wire 17 bonded to the wiring pattern $3c_3$, and may cover the wiring patterns $3c_2$ and $3c_3$. In this case, the resin layers 21 and 22 may include at least a portion of the front surfaces of the wiring patterns $3c_1$, $3c_2$, and $3c_3$, and may be provided integrally on both front surfaces of the semiconductor elements 11 and 12. All of the wire 15, the wire 16, and the wire 17 may be covered by the resin layers 21 and 22. By covering the entirety of the wires, deformation of the wires due to vibrations or the like is prevented and it is possible to reduce the load occurring at the wire bonding portions, thereby increasing the reliability.

The gel filler material 23 is a material for sealing each configurational component of the semiconductor device 100, and silicone gel can be used as the gel filler material 23, for example. After the insulated substrate 3, the semiconductor elements 11 and 12, the terminals 5, 6, and 7, the wires 15, 16, and 17, and the resin layers 21 and 22 are provided in the case 1 (on the base substrate 1a), the gel filler material 23 is poured onto these components. Furthermore, by placing the cover 2 on the side portions of the case 1, each configurational component is sealed inside the case 1. Remaining portions of the wires 15, 16, and 17, aside from the bonding portions covered by the resin layers 21 and 22, are exposed in the gel filler material 23.

Figure 2:
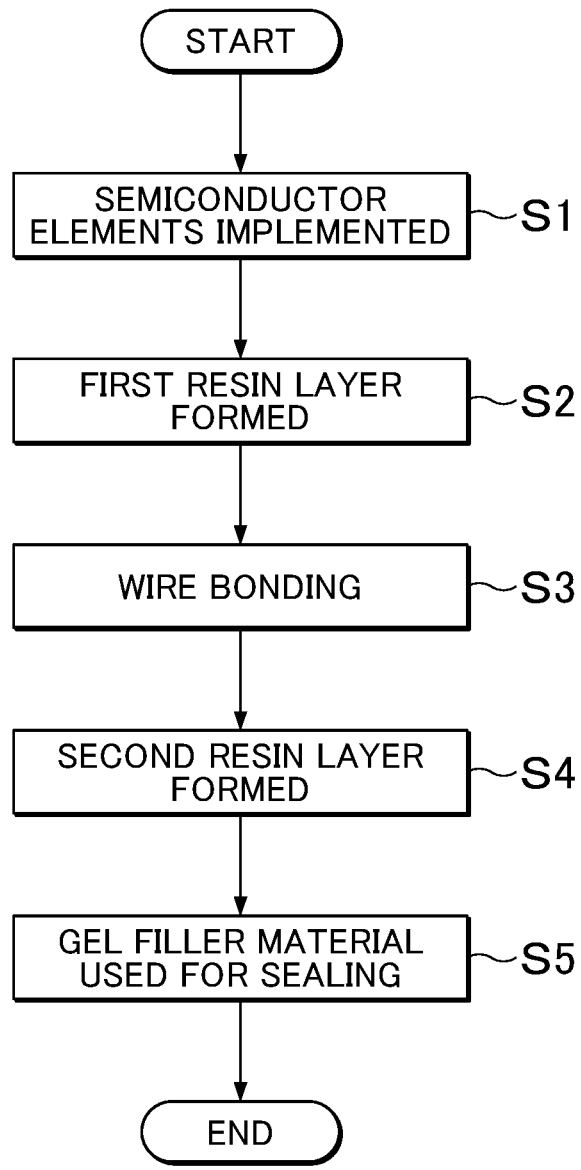
FIG. 2 shows a flow of a first manufacturing process for the semiconductor device.

FIG. 2 shows a flow of a first manufacturing process for the semiconductor device 100.

Figure 3:
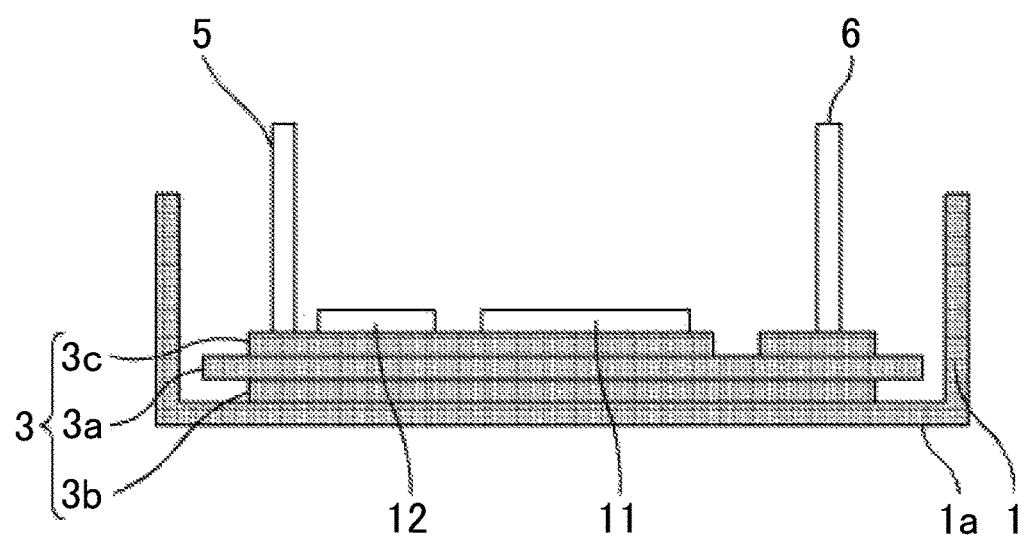
FIG. 3 shows a state in which the semiconductor elements are implemented in the first manufacturing process for the semiconductor device.

At step S1, the semiconductor elements 11 and 12 are implemented. As shown in FIG. 3, first, the insulated substrate 3 is installed on the base substrate 1a (inside the case 1) with a bonding material (not shown) such as solder interposed therebetween. Next, the semiconductor elements 11 and 12 are installed in parallel on the wiring pattern $3c_1$ in the wiring layer 3 of the insulated substrate 3 with a bonding material (not shown) such as solder interposed therebetween. Next, the terminals 5, 6, and 7 are established respectively on the wiring patterns $3c_1$, $3c_2$, and $3c_3$ with a bonding material (not shown) such as solder interposed therebetween. Finally, reflow is performed on the bonding material using a reflow furnace, thereby bonding the insulated substrate 3 on the base substrate 1a, bonding the semiconductor elements 11 and 12 on the wiring pattern $3c_1$ of the insulated substrate 3, and bonding the bottom ends of the terminals 5, 6, and 7 respectively on the wiring patterns $3c_1$, $3c_2$, and $3c_3$ of the insulated substrate 3.

The reflow furnace can be an H2 reflow furnace if sheet solder is used as the bonding material, or can be an N2 reflow furnace if solder including flux is used. Furthermore, if solder is used as the bonding material, lead-free solder such as Sn—Ag—Cu, Sn—Sb, Sn—Sb—Ag, Sn—Cu, Sn—Sb—Ag—Cu, Sn—Cu—Ni, Sn—Ag, types of solder, for example, is preferably used.

At step S2, the first resin layers 21a and 22a are formed.

Figure 4:
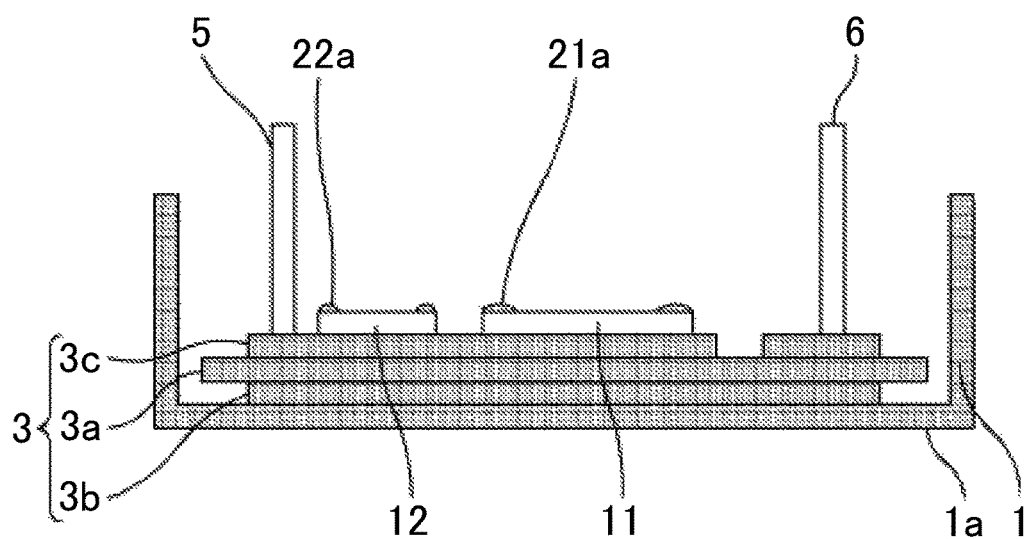
FIG. 4 shows a state in which the second resin layer has been formed in the first manufacturing process for the semiconductor device.

As shown in FIG. 4, polyimide is applied to the circumferential edge of the front surface of the semiconductor element 11 by an inkjet coating device or a dispenser coating device, for example, and this polyimide is then dried to form the first resin layer 21a. The guard ring 11c of the semiconductor element 11 is covered by the first resin layer 21a.

In the same manner, polyimide is applied to the circumferential edge of the front surface of the semiconductor element 12, and this polyimide is then dried to form the first resin layer 22a. The guard ring 12b of the semiconductor element 12 is covered by the first resin layer 22a. Step S2 must be performed before the wire bonding at step S3 described further below, but not necessarily immediately before the wire bonding.

Figure 5:
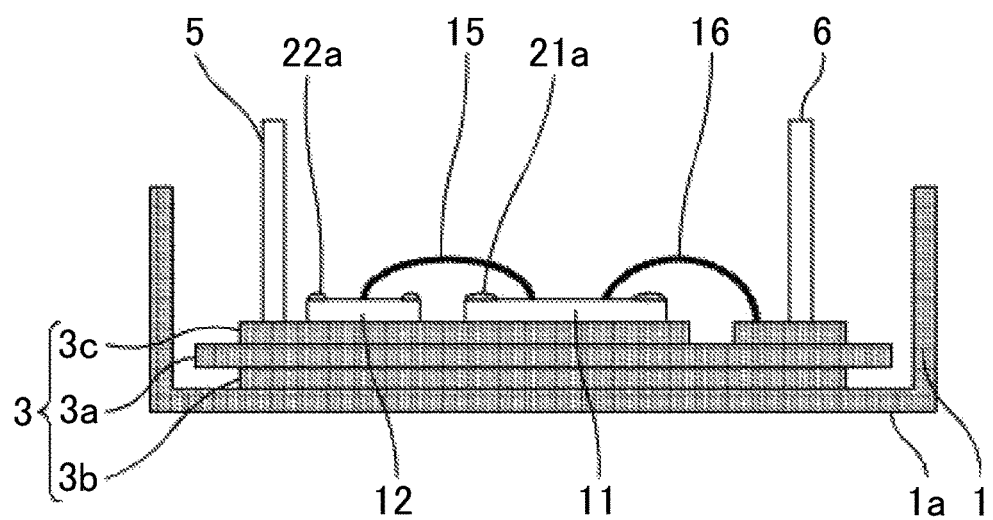
FIG. 5 shows a state in which the wires have been bonded in the first manufacturing process for the semiconductor device.

At step S3, the wires 15, 16, and 17 are bonded. As shown in FIG. 5, first, the ends of the wire 15 are respectively bonded to the front surface electrode of the semiconductor element 11, i.e. the emitter electrode 11a, and the front surface electrode of the semiconductor element 12, i.e. the anode electrode 12a. Next, the ends of the wire 16 are respectively bonded to the front surface electrode of the semiconductor element 11, i.e. the emitter electrode 11a, and the wiring pattern $3c_2$. Finally, the ends of the wire 17 are respectively bonded to the front surface electrode of the semiconductor element 11, i.e. the gate electrode 11b, and the wiring pattern $3c_3$.

At step S4, the second resin layers 21b and 22b are formed.

Figure 6:
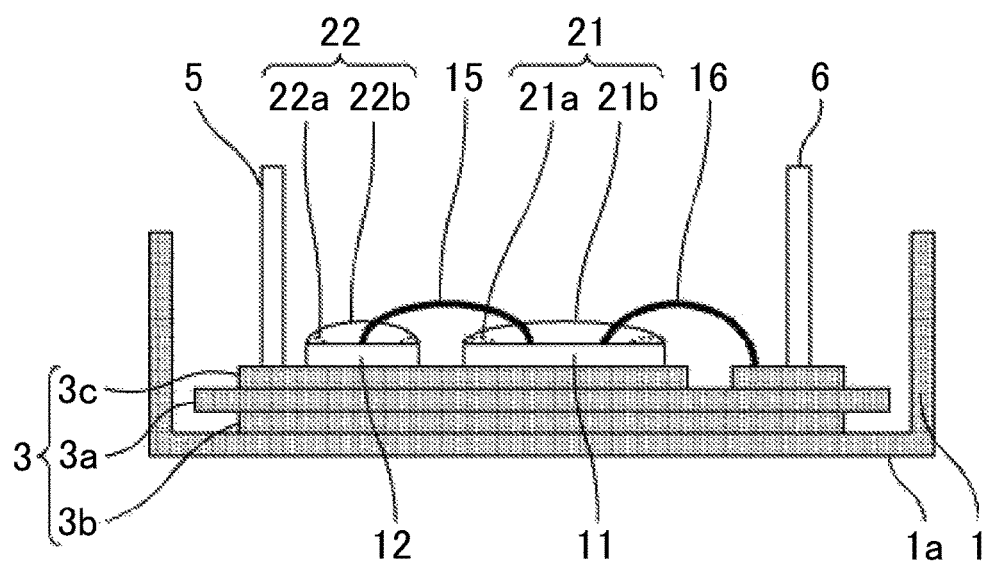
FIG. 6 shows a state in which the first resin layer has been formed in the first manufacturing process for the semiconductor device.

As shown in FIG. 6, the polyimide is applied to the center of the front surface of the semiconductor element 11 by a dispenser coating device, for example, and the polyimide is then dried to form the second resin layer 21b. The bonding portion of the wires 15 and 16 bonded to the emitter electrode 11a of the semiconductor element 11 and the bonding portion of the wire 17 bonded to the gate electrode 11b are covered by the second resin layer 21b. Here, the first resin layer 21a and the second resin layer 21b may be formed integrally to form the resin layer 21 by applying the polyimide in a manner to overlap with at least a portion of the first resin layer 21a formed on the circumferential edge of the front surface of the semiconductor element 11, or the second resin layer 21b may be formed separately from the first resin layer 21a by applying the polyimide in a manner to not overlap with the first resin layer 21a.

In the same manner, polyimide is applied to the center of the front surface of the semiconductor element 12 and then dried to form the second resin layer 22b. The bonding portion of the wire 15 bonded to the anode electrode 12a of the semiconductor element 12 is covered by the second resin layer 22b. Here, the first resin layer 22a and the second resin layer 22b may be formed integrally to form the resin layer 22 by applying the polyimide in a manner to overlap with at least a portion of the first resin layer 22a formed on the circumferential edge of the front surface of the semiconductor element 12, or the second resin layer 22b may be formed separately from the first resin layer 22a by applying the polyimide in a manner to not overlap with the first resin layer 22a.

In the previously performed step S2, after the polyimide is applied on the circumferential edge of the front surfaces of the semiconductor elements 11 and 12 and the first resin layers 21a and 22a are formed, the second resin layers 21b and 22b can be formed without applying the polyimide outside of the front surfaces of the semiconductor elements 11 and 12 beyond the first resin layers 21a and 22a and with a greater thickness than the first resin layers 21a and 22a, by applying the polyimide to the inside of the center of the front surface of the semiconductor element 11, i.e. the first resin layers 21a and 22a, to form the second resin layers 21b and 22b at step S4.

Figure 7:
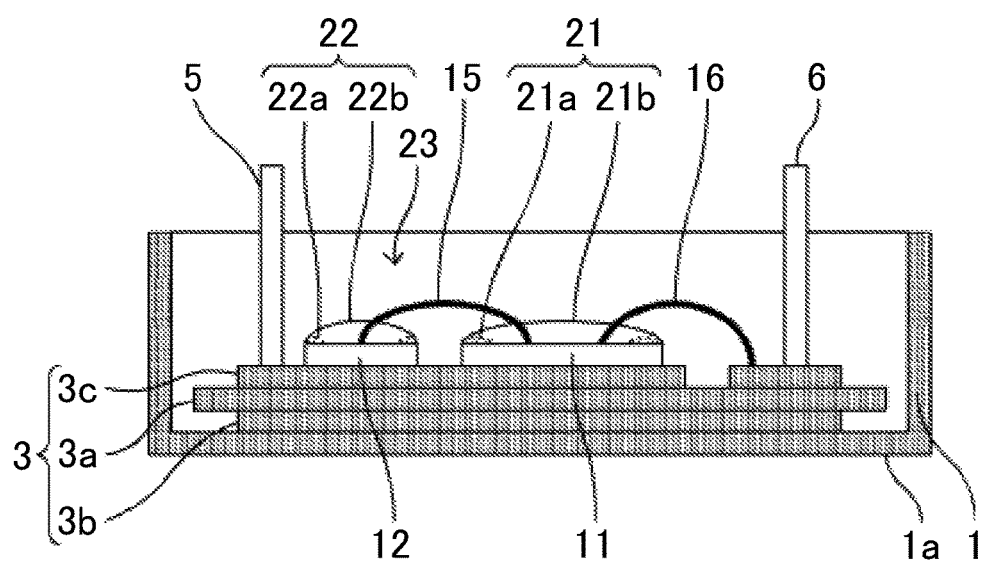
FIG. 7 shows a state in which sealing with the gel filler material has been performed in the first manufacturing process for the semiconductor device.

At step S5, each configurational element of the semiconductor device 100 is sealed by the gel filler material 23. As shown in FIG. 7, first, the gel filler material 23 is poured onto the insulated substrate 3, the semiconductor elements 11 and 12, the terminals 5, 6, and 7, the wires 15, 16, and 17, and the resin layers 21 and 22. Next, the cover 2 is mounted on the side portion of the case 1 such that the top ends of the terminals 5, 6, and 7 pass through the openings 2a of the cover 2. Finally, the cover 2 is bonded to the case 1.

In the first manufacturing method, the first and second resin layers 21a and 21b are respectively formed on the semiconductor element 11 at different steps (i.e. step S2 and step S4), and the first and second resin layers 22a and 22b are respectively formed on the semiconductor element 12 at different steps (i.e. step S2 and step S4) in the same manner, but instead, the first and second resin layers 21a and 21b may be formed integrally as the integrated resin layer 21 on the semiconductor element 11 in a single step, and the first and second resin layers 22a and 22b may be formed integrally as the integrated resin layer 22 on the semiconductor element 12 in a single step, in the same manner.

Figure 8:
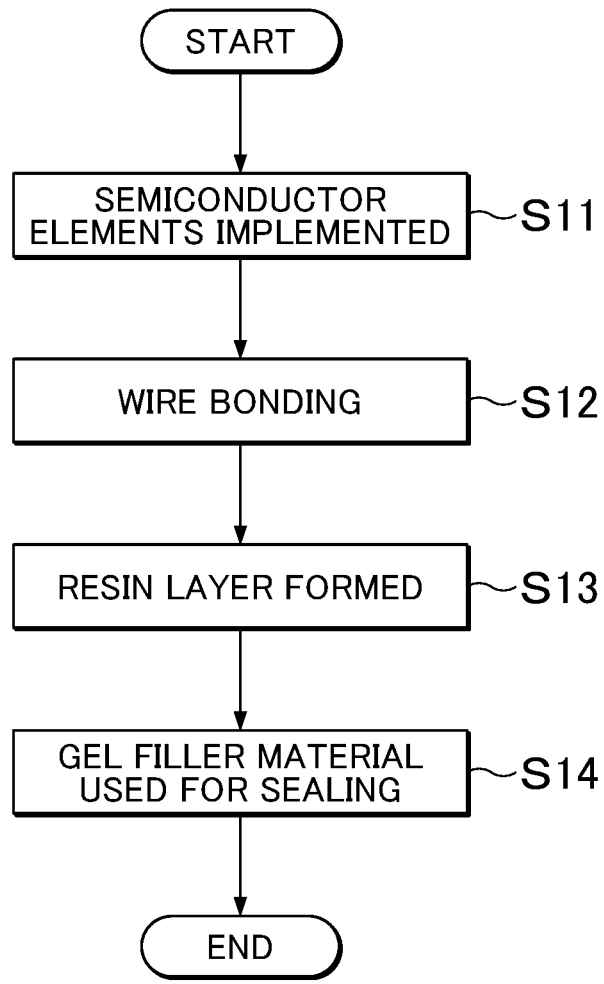
FIG. 8 shows a flow of a second manufacturing process for the semiconductor device.

FIG. 8 shows a flow of a second manufacturing method for the semiconductor device 100.

Figure 9:
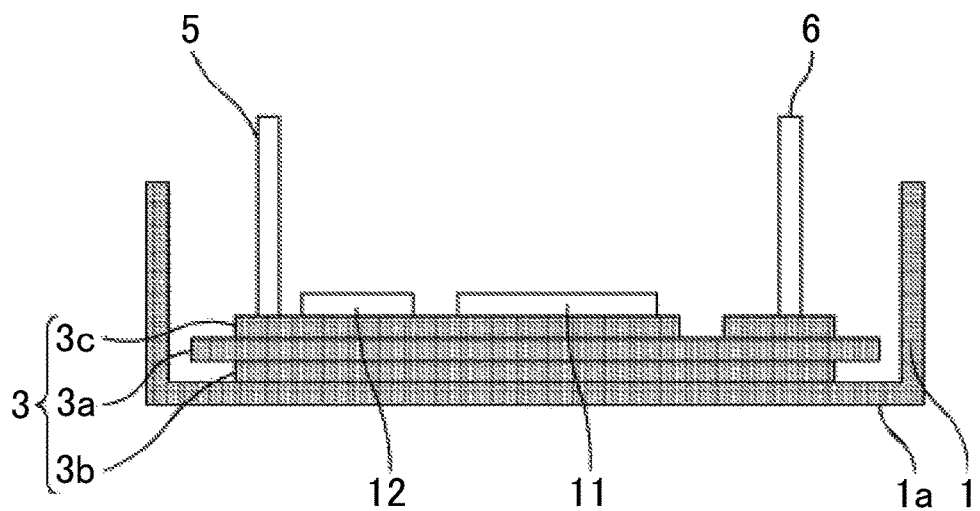
FIG. 9 shows a state in which the semiconductor elements are implemented in the second manufacturing process for the semiconductor device.

At step S11, the semiconductor elements 11 and 12 are implemented. As shown in FIG. 9, the insulated substrate 3 is installed on the base substrate 1a (inside the case 1), the semiconductor elements 11 and 12 are provided in parallel on the wiring pattern $3c_1$ in the wiring layer 3c of the insulated substrate 3, and the terminals 5, 6, and 7 are respectively established on the wiring patterns $3c_1$, $3c_2$, and $3c_3$. The details of this process are the same as in step S1 described above.

Figure 10:
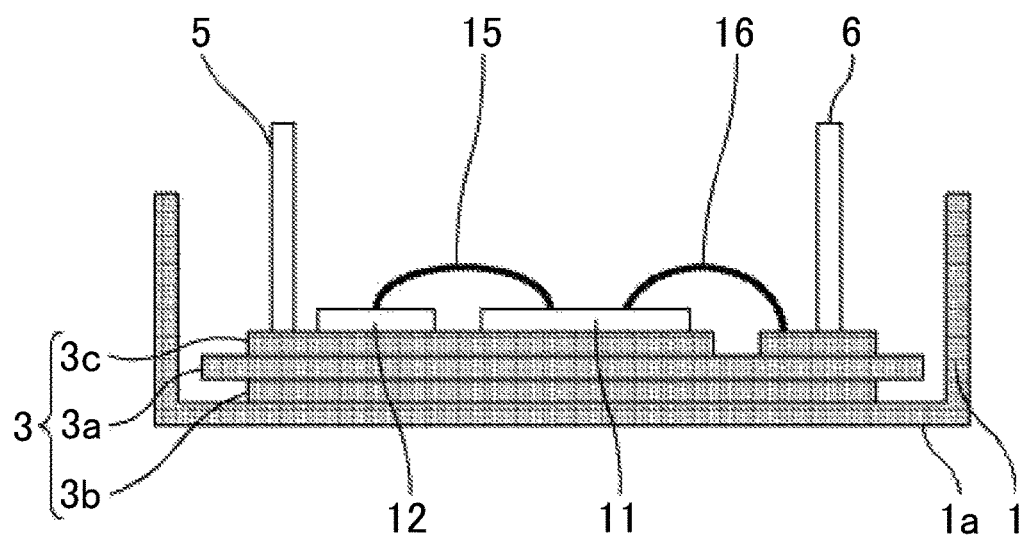
FIG. 10 shows a state in which the wires have been bonded in the second manufacturing process for the semiconductor device.

At step S12, the wires 15, 16, and 17 are bonded. As shown in FIG. 10, the ends of the wire 15 are respectively bonded to the emitter electrode 11a of the semiconductor element 11 and the anode electrode 12a of the semiconductor element 12, the ends of the wire 16 are respectively bonded to the emitter electrode 11a of the semiconductor element 11 and the wiring pattern $3c_2$, and the ends of the wire 17 are respectively bonded to the gate electrode 11b of the semiconductor element 11 and the wiring pattern $3c_3$. The details of this process are the same as in step S3 described above.

At step S13, the resin layers 21 and 22 are formed.

Figure 11:
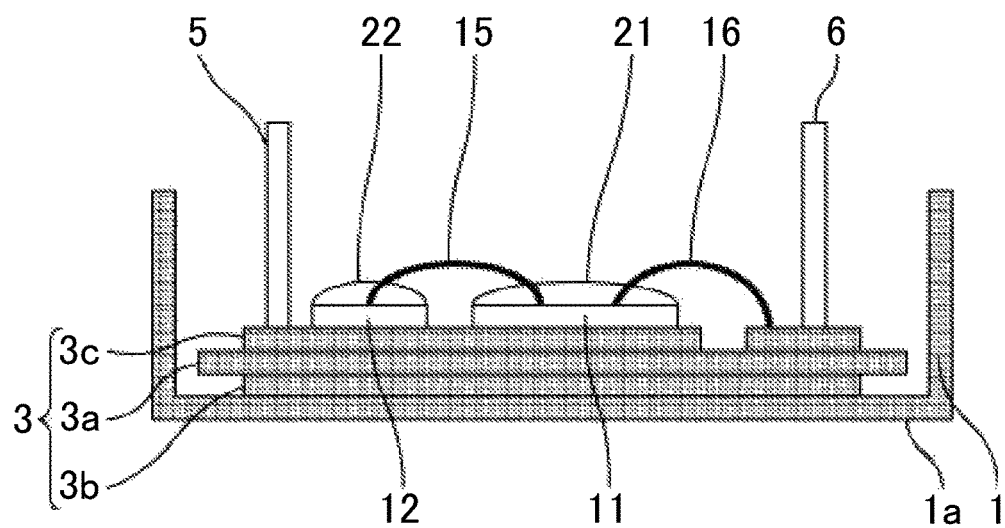
FIG. 11 shows a state in which the resin layer has been formed in the second manufacturing process for the semiconductor device.

As shown in FIG. 11, the polyimide is applied to the entire front surface of the semiconductor element 11 by a dispenser coating device, for example, and the polyimide is then dried to form the resin layer 21. The bonding portion of the wires 15 and 16 bonded to the emitter electrode 11a of the semiconductor element 11 and the bonding portion of the wire 17 bonded to the gate electrode 11b are covered by the resin layer 21, and the guard ring 11c of the semiconductor element 11 is also covered by the resin layer 21.

In the same manner, polyimide is applied to the entire front surface of the semiconductor element 12 and then dried to form the resin layer 22. The bonding portion of the wire 15 bonded to the anode electrode 12a of the semiconductor element 12 is covered by the resin layer 22, and the guard ring 12b of the semiconductor element 12 is also covered by the resin layer 22.

Figure 12:
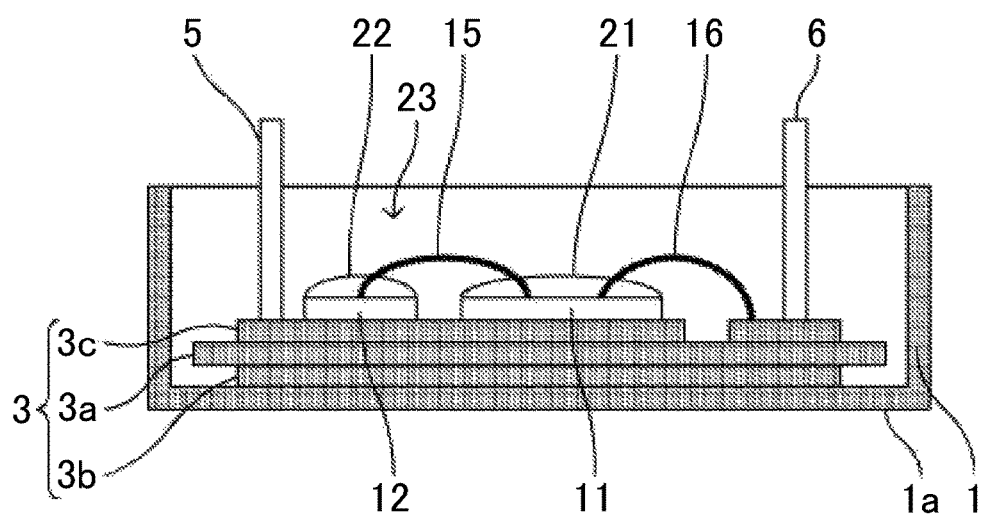
FIG. 12 shows a state in which sealing with the gel filler material has been performed in the second manufacturing process for the semiconductor device.

At step S14, each configurational component of the semiconductor device 100 is sealed by the gel filler material 23. As shown in FIG. 12, the inside of the case 1 is filled with the gel filler material 23, and the cover 2 is mounted on and bonded to the side portions of the case 1. The details of this process are the same as in step S5 described above.

EMBODIMENT EXAMPLES

The following provides embodiment examples of to further describe the present invention, but these embodiment examples do not limit the scope of the present invention.

First Embodiment Example

A semiconductor device 100 was manufactured using the second manufacturing method. A denka AlN plate (Al circuit AlN substrate manufactured by Denka Company Limited) was used as the insulated substrate 3, in which the thickness of the insulated board 3a is 1.0 mm, the thickness of the metal layer 3b and the wiring layer 3c is 0.2 mm, the separation distance (frame length) between the end of the wiring layer 3c and the end of the insulated board 3a is 1.5 mm, and the separation distance (frame length) between the end of the metal layer 3b and the end of the insulated board 3a is 0.5 mm. Furthermore, an Si semiconductor IGBT and an SiC semiconductor SBD were used as the semiconductor elements 11 and 12. An AlSiC substrate (manufactured by Denka Company Limited) was used as the base substrate 1a.

At step S11, solder (Sn-8Sb-3Ag pellet manufactured by Nihon Handa Co. Ltd.) was used as the bonding material for bonding the semiconductor elements 11 and 12 on the insulated substrate 3. Furthermore, solder (Sn-40Pb pellet manufactured by Nihon Handa Co. Ltd.) was used as the bonding material for bonding the insulated substrate 3 on the base substrate 1a, At step S12, aluminum wires with a diameter of 400 μm were used as the wires 15, 16, and 17.

At step S13, Upia ((Registered Trademark) manufactured by UBE Industries Ltd with a glass transition temperature of 324° C.) was used as the polyimide applied to the entire front surfaces of the semiconductor elements 11 and 12, i.e. both the circumferential edges and the centers of the front surface, a SHOTMASTER ((Registered Trademark) manufactured by Musashi Engineering, Inc.) was used as the dispenser coating device, and the polyimide was applied with a film thickness of 50 μm.

At step S14, TSE3051SK (manufactured by Momentive Performance Materials, Inc.) was used as the gel filler material 23. The inside of the case 1 was filled with the gel filler material 23, and heating was performed for 1 hour at 100° C. The cover 2 was bonded on the side portions of the case 1 using an adhesive.

First Comparative Example

Manufacturing was performed in the same manner as in the first embodiment example, except that step S13 was omitted and the resin layers 21 and 22 were not formed.

Second Comparative Example

Manufacturing was performed in the same manner as in the first embodiment example, except that the polyimide used in step S13 was changed to CT4112A1 (manufactured by KYOCERA Chemical Corporation with a glass transition temperature of 170° C.).

Third Comparative Example

Manufacturing was performed in the same manner as in the first embodiment example, except that in step S13, the polyimide was applied only to the circumferential edge of the front surfaces of the semiconductor elements 11 and 12, and only the guard rings 11c and 12b are covered by the resin layers (corresponding to the first resin layers 21a and 22a).

Fourth Comparative Example

Manufacturing was performed in the same manner as in the first embodiment example, except that in step S13, the polyimide was applied only to the centers of the front surfaces of the semiconductor elements 11 and 12, and only the bonding portions of the wires 15, 16, and 17 were covered by the resin layers.

Fifth Comparative Example

Manufacturing was performed in the same manner as in the first embodiment example, except that the film thickness of the resin layers was 8 μm.

(Evaluation)

For each of the semiconductor devices according to the first embodiment example and the first to fourth comparative examples, testing was performed by applying a reverse bias of 3.3 kV at a temperature of 150° C. using an application testing device (CS-5400 manufactured by Iwatsu Electric Co. Ltd.), and the number of semiconductor devices that experienced insulation breakdown (referred to as the number of breakdowns) particularly at the interface between the semiconductor element 12 and the gel filler material 23 was evaluated. This number of breakdowns indicates the insulation endurance of the semiconductor devices. Furthermore, a power cycle evaluation (chip junction temperature of 150° C.) was performed at a temperature of 25° C. and a temperature of 150° C., and the number of power cycles in which the change rate of the thermal resistance exceeded 20% (referred to as the power cycle endurance) was evaluated. When the insulation endurance is high (i.e. when there is a low number of breakdowns) and the power cycle endurance is high (i.e. when the number of power cycles is high), this means that the semiconductor device has high reliability.

TABLE 1

| | FIRST EMBODIMENT EXAMPLE | FIRST COMPARATIVE EXAMPLE | SECOND COMPARATIVE EXAMPLE | THIRD COMPARATIVE EXAMPLE | FOURTH COMPARATIVE EXAMPLE | FIFTH COMPARATIVE EXAMPLE |
|---|---|---|---|---|---|---|
| PRESENCE OF RESIN LAYER (LOCATION, THICKNESS, AND GLASS TRANSITION TEMPERATURE OF | PRESENT (GUARD RING AND ELECTRODES, 50 μm, 324° C.) | NOT PRESENT | PRESENT (GUARD RINGS AND ELECTRODES, 50 μm, 170° C.) | PRESENT (GUARD RINGS ONLY, 50 μm, 324° C.) | PRESENT (ELECTRODES ONLY, 50 μm, 324° C.) | PRESENT (GUARD RINGS AND ELECTRODES, 8 μm, 324° C.) |

TABLE 1-continued

| | FIRST EMBODIMENT EXAMPLE | FIRST COMPARATIVE EXAMPLE | SECOND COMPARATIVE EXAMPLE | THIRD COMPARATIVE EXAMPLE | FOURTH COMPARATIVE EXAMPLE | FIFTH COMPARATIVE EXAMPLE |
|---|---|---|---|---|---|---|
| THE POLYIMIDE USED IN THE RESIN LAYER) | | | | | | |
| NUMBER OF BREAKDOWNS (PER 100 DEVICES) FROM APPLICATION TESTING | 0 | 6 | 2 | 0 | 6 | 4 |
| NUMBER OF POWER CYCLES | 300,000 | 150,000 | 200,000 | 150,000 | 300,000 | 300,000 |

For the semiconductor device according to the first embodiment example, the evaluation indicated that the number of breakdowns due to the application test was 0 per 100 semiconductor devices and the number of power cycles was 300,000. It was judged that the insulation endurance was improved by forming the resin layer 22 using polyimide at a temperature greater than or equal to the glass transition temperature of 200° C. on the entire front surface of the semiconductor element 12 and relaxing the focusing of the electrical field strength between the front surface of the semiconductor element 12 and the gel filler material 23 by first protecting the guard ring 12b, and that the power cycle endurance was improved by restricting the occurrence of degradation of the electrode film of the semiconductor element 12 and wire cracking by further protecting the bonding portion of the wire 15.

For the semiconductor device according to the first comparative example, the evaluation indicated that the number of breakdowns due to the application test was 6 per 100 semiconductor devices and the number of power cycles was 150,000. This evaluation suggests that the electrical field was focused at the interface between the front surface of the semiconductor element 12 and the gel filler material 23 and caused an insulation breakdown since the resin layer 22 was not formed on the front surface of the semiconductor element 12, and therefore the guard ring 12b was not protected, and also that degradation of the electrode film and/or wire cracking occurred because the bonding portion of the wire 15 bonded to the anode electrode 12a was not protected.

For the semiconductor device according to the second comparative example, the evaluation indicated that the number of breakdowns due to the application test was 2 per 100 semiconductor devices and the number of power cycles was 200,000. This evaluation shows an improvement in the insulation endurance and the power cycle endurance compared to the first comparative example in which the resin layer 22 was not formed on the front surface of the semiconductor element 12 and the bonding portion between guard ring 12b and wire 15 was not protected. However, this improvement is clearly small compared to the semiconductor device according to the first embodiment example. This evaluation suggests that the physical characteristics of the resin layer 22 changed as an effect of the temperature during the power cycle evaluation and the application test because the resin layer 22 was formed using polyimide with a lower glass transition temperature than the polyimide used in the semiconductor device according to the first embodiment example, and also that the bonding portion between the guard ring 12b and the wire 15 could not be sufficiently protected.

For the semiconductor device according to the third comparative example, the evaluation indicated that the number of breakdowns due to the application test was 0 per 100 semiconductor devices, but the number of power cycles was 150,000. This evaluation suggests that, in the same manner as in the first comparative example, electrode film degradation and/or wire cracking occurred because the resin layer 22 was not formed in the center of the front surface of the semiconductor element 12 and the bonding portion between the anode electrode 12a and the wire 15 was not protected.

For the semiconductor device according to the fourth comparative example, the evaluation indicated that the number of power cycles was 300,000, in the same manner as in the first embodiment example, but the number of breakdowns due to the application test was 6 per 100 semiconductor devices. This evaluation suggests that the electrical field was focused at the interface between the front surface of the semiconductor element 12 and the gel filler material 23 and caused insulation breakdown, because the resin layer 22 was not formed on the circumferential edge of the front surface of the semiconductor element 12 and the guard ring 12b was not protected.

For the semiconductor device according to the fifth comparative example, the evaluation indicated that the number of power cycles was 300,000, in the same manner as the first embodiment example, but the number of breakdowns due to the application test was 4 per 100 semiconductor devices. This evaluation suggests that the electrical field relaxation effect was not significantly achieved, because the film thickness of the resin layer 22 was a low value of 8 µm.

Based on the above evaluations, the semiconductor device 100 according to the present embodiment can guarantee the reliability of the semiconductor device by using the resin layer to protect the bonding portions between the wires and the electrodes of the semiconductor element mounted in the semiconductor device 100, and can also improve the withstand voltage of the semiconductor device by using the resin layer to protect the guard ring of the semiconductor element.

In the semiconductor device 100 according to the present embodiment, the semiconductor element 11 is not limited to being an Si semiconductor device formed from an Si semiconductor and the semiconductor element 12 is not limited to being an SiC semiconductor device formed from an SiC semiconductor, and these semiconductor elements may be any semiconductor devices formed from a semiconductor. The semiconductor elements 11 and 12 may each be a single semiconductor device or a combination of any number of semiconductor devices.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, with the embodiments of the present invention, it is possible to realize a semiconductor device that can ensure reliability and improve the withstand voltage.

What is claimed is:

1. A semiconductor device comprising:
    a first semiconductor element that includes a first front surface electrode and a first electrical guard ring at an edge of the first semiconductor element;
    a second semiconductor element that includes a second front surface electrode and a second electrical guard ring at an edge of the second semiconductor element;
    a first wire that is wire-bonded to the first front surface electrode;
    a second wire that is wire-bonded to the second front surface electrode;
    a first resin layer that covers only an area including the first electrical guard ring of the first semiconductor element and not including the first front surface electrode, and only an area including the second electrical guard ring of the second semiconductor element and not including the second front surface electrode; and
    a gelatinous filler material that seals the first semiconductor element, the second semiconductor element, the first wire, the second wire, and the first resin layer,
    wherein a portion of the first wire that is wire-bonded and a portion of the second wire that is wire-bonded are exposed in the gelatinous filler material to thereby cover an entire circumference of the first wire and the second wire, and
    wherein the first resin layer is formed of a different material than the gelatinous filler material.

2. The semiconductor device according to claim 1, further comprising:
    a second resin layer that covers at least one of a first bonding portion between the first front surface electrode and the first wire and a second bonding portion between the second front surface electrode and the second wire.

3. The semiconductor device according to claim 1, wherein
    the first resin layer includes polyimide.

4. The semiconductor device according to claim 3, wherein
    the polyimide has a glass transition temperature greater than or equal to 200° C.

5. The semiconductor device according to claim 1, wherein
    the first resin layer has a thickness from 10 µm to 50 µm.

6. The semiconductor device according to claim 2, wherein
    the second resin layer has a thickness from 10 µm to 50 µm.

7. The semiconductor device according to claim 1, wherein
    the gelatinous filler material includes silicone gel.

8. The semiconductor device according to claim 1, wherein
    the first semiconductor element is an SiC semiconductor element, and
    the second semiconductor element is an Si semiconductor element or an SiC semiconductor element.

9. The semiconductor device according to claim 1, further comprising:
    a substrate on which the first semiconductor element and the second semiconductor element are mounted; and
    a case that houses, in an internal space thereof, the first semiconductor element, the second semiconductor element, the substrate, the first wire, the second wire, and the first resin layer, the internal space being filled with the gelatinous filler material.

* * * * *